(12) United States Patent
Kräuter

(10) Patent No.: US 9,455,379 B2
(45) Date of Patent: Sep. 27, 2016

(54) CARRIER, OPTOELECTRONIC UNIT COMPRISING A CARRIER AND METHODS FOR THE PRODUCTION OF BOTH

(75) Inventor: Gertrud Kräuter, Regensburg (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 275 days.

(21) Appl. No.: 14/112,510

(22) PCT Filed: Apr. 26, 2012

(86) PCT No.: PCT/EP2012/057677
§ 371 (c)(1),
(2), (4) Date: Dec. 5, 2013

(87) PCT Pub. No.: WO2012/146669
PCT Pub. Date: Nov. 1, 2012

(65) Prior Publication Data
US 2014/0159093 A1 Jun. 12, 2014

(30) Foreign Application Priority Data
Apr. 28, 2011 (DE) .................. 10 2011 018 921

(51) Int. Cl.
*H01L 31/00* (2006.01)
*H01L 33/48* (2010.01)
*H01L 33/60* (2010.01)

(52) U.S. Cl.
CPC ............. *H01L 33/48* (2013.01); *H01L 33/60* (2013.01); *H01L 33/486* (2013.01); *H01L 2224/48091* (2013.01); *H01L 2224/48247* (2013.01); *H01L 2224/73265* (2013.01); *H01L 2933/0033* (2013.01)

(58) Field of Classification Search
CPC ..... H01L 33/48; H01L 33/60; H01L 33/486; H01L 2224/48091; H01L 2224/73265; H01L 2224/48247; H01L 2224/00014
See application file for complete search history.

(56) References Cited

U.S. PATENT DOCUMENTS

| 6,236,061 | B1 | 5/2001 | Walpita |
| 6,950,236 | B2 | 9/2005 | Hokazono et al. |
| 2003/0125416 | A1* | 7/2003 | Munro ............ C09D 5/004 523/171 |
| 2004/0070824 | A1* | 4/2004 | Toda ............ B82Y 20/00 359/452 |
| 2007/0001581 | A1 | 1/2007 | Stasiak et al. |
| 2008/0224159 | A1 | 9/2008 | Krauter et al. |
| 2010/0307558 | A1* | 12/2010 | Yamazaki ......... H01L 31/028 136/244 |
| 2012/0112220 | A1* | 5/2012 | West ............ H01L 33/60 257/98 |

FOREIGN PATENT DOCUMENTS

| CN | 1502048 A | 6/2004 |
| CN | 101241207 A | 8/2008 |
| DE | 10153259 A1 | 5/2003 |
| DE | 102005036520 A1 | 11/2006 |
| DE | 102010013317 A1 | 10/2011 |
| JP | 2002353074 A | 12/2002 |
| JP | 2006160981 A | 6/2006 |
| JP | 200988335 A | 4/2009 |

(Continued)

*Primary Examiner* — Trung Q Dang
(74) *Attorney, Agent, or Firm* — Slater Matsil, LLP

(57) ABSTRACT

A carrier for an optoelectronic unit has a carrier material which includes polyethylene terephthalate which contains reflector particles and a further filler. Methods for the production of the optoelectronic unit and the carrier are also disclosed.

20 Claims, 4 Drawing Sheets

(56) References Cited

FOREIGN PATENT DOCUMENTS

| | | |
|---|---|---|
| JP | 2010161234 A | 7/2010 |
| JP | 2010270177 A | 12/2010 |
| TW | 200702153 | 1/2007 |
| WO | 2006114082 A2 | 11/2006 |
| WO | 2008060490 A2 | 5/2008 |

* cited by examiner

CARRIER, OPTOELECTRONIC UNIT COMPRISING A CARRIER AND METHODS FOR THE PRODUCTION OF BOTH

This patent application is a national phase filing under section 371 of PCT/EP2012/057677, filed Apr. 26, 2012, which claims the priority of German patent application 10 2011 018 921.1, filed Apr. 28, 2011, each of which is incorporated herein by reference in its entirety.

TECHNICAL FIELD

A carrier, an optoelectronic unit comprising a carrier and methods for production of both are provided.

BACKGROUND

In the prior art housing materials for light-emitting diodes are known which are based, for example, on white, thermoplastic polymers such as, for instance, polyamides which are stable at high temperatures. However, it has been shown that these materials can have a tendency towards yellowing at elevated temperatures and under the effect in particular of blue light. Such ageing behavior can reduce, for example, the light intensity of a light-emitting diode by a reduced reflection capacity of the housing.

Although thermoplastics with improved ageing behavior are known, for example, liquid crystal polymers (LCP) or polyetheretherketones (PEEK). These materials do have a lower reflectivity, whereby light loss owing to reduced radiating intensity needs to be taken into account.

Furthermore, white silicones are also known which, however have mechanical weaknesses, in particular brittleness, and are very expensive.

SUMMARY OF THE INVENTION

Embodiments provide a carrier for an optoelectronic semiconductor unit. Further objects of specific embodiments are to provide an optoelectronic unit with a carrier and methods for the production of a carrier or of an optoelectronic unit.

In accordance with at least one embodiment, a carrier has a carrier material which contains polyethylene terephthalate. It has been established in accordance with the invention that a very good level of resistance to yellowing can be achieved by the polyethylene terephthalate in the carrier material. This is true in particular when the carrier is irradiated with energy-rich light, i.e., for example, blue and/or ultraviolet light, and is at a simultaneously elevated temperature. It has been observed that polyamides conventionally used according to the prior art show clear signs of ageing in the irradiated areas even after relatively brief irradiation with blue light at an elevated temperature of about 120° C. In contrast, such signs of ageing were not observed in the carrier material described herein under similar irradiation conditions and even at a still higher temperature. Therefore, in the case of the carrier described herein with the polyethylene terephthalate-containing carrier material, signs of ageing, in particular at light wavelengths in a blue to ultraviolet spectral range could be avoided.

In accordance with a further embodiment, the carrier material comprises reflector particles. The reflector particles can be distributed, in particular, in the polyethylene terephthalate of the carrier material. Furthermore, the reflector particles can be suitable, in particular, to provide the carrier material with reflective and/or light-scattering properties. For this purpose, the reflector particles can be light-scattering and/or light-reflecting. In particular, the carrier material can appear colored by the reflector particles. It is particularly advantageous if the reflector particles color the carrier material white, which means that the carrier is reflective in a broad spectral range, in particular, in the visible spectral range and, in a particularly preferred manner, in the ultraviolet, visible and/or infrared spectral range. Furthermore, it may also be possible that, by means of the reflector particles and the associated coloring of the carrier material, its irradiation resistance can be increased.

In accordance with a further embodiment, the reflector particles have an achromatic inorganic pigment with a high refraction index of preferably greater than or equal to 1.7. The reflector particles can thereby comprise at least one or a plurality of the following materials: titanium oxide, in particular, titanium dioxide ($TiO_2$), zinc oxide (ZnO), zirconium oxide, in particular, zirconium dioxide ($ZrO_2$), barium sulphate ($BaSO_4$).

In accordance with a further embodiment, the reflector particles have, in a particularly preferred manner, particle sizes of 200 to 500 nm. The particle sizes can be measured, for example, by means of screening methods. In such a size range, the reflector particles are particularly suitable for high reflectivity and furthermore also ensure advantageous properties with respect to the dimensional stability of the carrier material.

In accordance with a further embodiment, the carrier material has a proportion of reflector particles which is greater than or equal to 15 wt. % in relation to the overall weight of the carrier material. Furthermore, the proportion of reflector particles can preferably be less than or equal to 30 wt. % of the carrier material.

In accordance with a further embodiment, the carrier material comprises polyethylene terephthalate and reflector particles. Tests have shown that, for example, polyethylene terephthalate colored with titanium dioxide has outstanding ageing stability and a very high level of reflectivity in comparison with the conventional materials for light-emitting diode housings from the prior art.

In accordance with a further embodiment, the carrier material has at least one further filler. The further filler can, in particular, increase the dimensional stability of the carrier during heating. In addition, the mechanical properties of the carrier can also be improved, for example, the stability of the carrier with respect to tensile and shear stresses.

In accordance with a further embodiment the carrier material comprises polyethylene terephthalate which contains reflector particles and at least one further filler. For example, the carrier material can consist essentially of polyethylene terephthalate, in which reflector particles and at least one further filler are contained and, in particular, for example, mixed in.

The further filler can comprise, for example, fiber-like materials, in particular, glass fibers. These can have, for example, an average length of 200 to 400 μm and an average diameter of 6 to 15 μm.

It has been shown that by the addition of glass fibers to the carrier material the dimensional stability under heat of the carrier material can be increased to about 255° C. in comparison with a mixture of polyethylene terephthalate and reflector particles, which guarantees, for example, solderability of the carrier at maximum temperatures of 250° C.+/−5° C.

In accordance with a further embodiment, the carrier material has a cross-linking additive. The dimensional stability under heat can be increased further by the cross-linking additive.

In accordance with a further embodiment, the carrier material comprises polyethylene terephthalate which contains reflector particles, at least one further filler and a cross-linking additive. For example, the carrier material can consist essentially of polyethylene terephthalate with the cross-linking additive, in which reflector particles and at least one further filler are contained and in particular, for example, mixed in.

In accordance with a further embodiment, the carrier material comprises tetraallyl isocyanurate as the cross-linking additive. The cross-linking additive can be added to the carrier material before formation of the carrier, for example, by mixing or melt-mixing. In particular, in the case of pure tetraallyl isocyanurate the cross-linking additive can be in liquid form, which means that it can be mixed into liquid or liquefied polyethylene terephthalate. Furthermore, it is also possible for the cross-linking additive, i.e., for example, tetraallyl isocyanurate, to be provided in the form of a masterbatch with polyethylene terephthalate or polybutylene terephthalate, in particular, as a highly concentrated masterbatch, and to be mixed into the above-mentioned materials for the carrier material, in particular, the polyethylene terephthalate, or to be mixed in by melt-mixing. The latter can also be defined as compounding-in. In this case, the carrier material can consist, for example, essentially of polyethylene terephthalate with the cross-linking additive and the polymer forming the basis of the masterbatch used, i.e., in a particularly preferred manner, polyethylene terephthalate or polybutylene terephthalate, in which reflector particles and at least one further filler are contained and, in particular, for example, mixed in.

The cross-linking additive can be cross-linked at least partially with the polyethylene terephthalate of the carrier material. By reason of the proportion of the cross-linking additive cross-linked with the polyethylene terephthalate, the dimensional stability under heat of the carrier material can be adjusted and, in particular, be increased in comparison with a carrier material without a cross-linking additive.

In a further embodiment, the cross-linking additive is completely cross-linked in the carrier material. In other words, the entire cross-linking additive present in the carrier material is incorporated in the polymer network of the carrier material. This type of complete incorporation or a complete cross-linking can be particularly advantageous if the cross-linking additive in a non-cross-linked form can result in yellowing or other signs of ageing of the carrier material.

In accordance with a further embodiment, the cross-linking additive has a proportion of less than or equal to 4 wt. % of the carrier material. Furthermore, the cross-linking additive can have a proportion of greater than or equal to 2 wt. % of the carrier material. The proportion of cross-linking additive which is added to the carrier material can further increase the dimensional stability under heat of the carrier, in particular after cross-linking in the polymer network of the carrier material, e.g., radiation cross-linking.

In accordance with a further embodiment, the carrier material has a cross-linking additive and a further filler. The further filler can have, e.g., glass fibers as described further above. Furthermore, the further filler can have glass spheres, glass spheres and/or mineral fillers or mixtures of the said materials. Cellulose fibers and mixtures of cellulose fibers with one or a plurality of the aforementioned materials can be included as further fillers in the carrier material. As mineral fillers, e.g., wollastonite, chalk (calcium carbonate) and/or talcum can be mixed in fiber, powder or platelet form into the carrier material. When using mineral fillers of this type, the carrier material can form a particularly smooth surface, so that a particularly smooth carrier outer surface can be achieved.

In accordance with a further embodiment, the carrier material has the further filler in a proportion of greater than or equal to 20 wt. % measured in the carrier material. Furthermore, the carrier material can have a proportion of less than or equal to 50 wt. % of the carrier material. By admixing the further filler in a proportion in the said range, it is possible in an advantageous manner to achieve a high degree of dimensional stability, in particular dimensional stability under heat, and an improvement in the mechanical stability.

In accordance with a further embodiment, the carrier material also comprises polybutylene terephthalate. In particular, it can be advantageous if the proportion of polybutylene terephthalate in the carrier material is less than or equal to 60 wt. %, preferably less than or equal to 20 wt. % and particularly preferably less than or equal to 10 wt. %. As a result, the carrier material can still contain a sufficiently high proportion of the polyethylene terephthalate. For example, the carrier material can consist substantially of polyethylene terephthalate with an admixture of polybutylene terephthalate having an aforementioned proportion, in particular of less than or equal to 20 wt. % and preferably less than or equal to 10 wt. %, of the carrier material, in which reflector particles and at least one further filler are contained and in particular, e.g., mixed. Furthermore, the carrier material can consist substantially of polyethylene terephthalate with an admixture of polybutylene terephthalate having an aforementioned proportion, in particular of less than or equal to 20 wt. % and preferably less than or equal to 10 wt. % of the carrier material, and with a cross-linking additive, in which reflector particles and at least one further filler are contained and in particular, e.g., mixed.

By admixing polybutylene terephthalate to the carrier material, it is possible to improve the processability and in particular also the crystallization of the carrier material. By virtue of the slightly longer alkylene chain of polybutylene terephthalate in comparison with polyethylene terephthalate, it is possible to improve the tendency of the carrier material towards crystallization. A high degree of crystallization of the carrier material in the finished carrier can ensure that the carrier material is dimensionally stable above the glass temperature. The dimensional stability of the carrier can be maximized by virtue of a particularly high degree of crystallization. Furthermore, by admixing polybutylene terephthalate, it is possible to optimize the carrier material in terms of mechanical properties such as, e.g., stiffness, strength, robustness, water absorption and shrinkage intake as well as improved chemical resistance. Furthermore, by admixing polybutylene terephthalate, it is possible to improve the radiation cross-linking capability of the carrier material.

It is also possible to achieve an increase in the degree of crystallization, e.g., if an injection-molding method is used to produce the carrier, in which the carrier material described herein is shaped by injection-molding and is cooled in an appropriately slow manner or in that a nucleating agent is added. By adding polybutylene terephthalate to the carrier material, it is additionally possible to influence the degree of crystallization.

In accordance with at least one further embodiment, an optoelectronic unit has a carrier having the features in accordance with at least one or several of the aforementioned embodiments. Furthermore, an optoelectronic semiconductor chip is disposed on the carrier.

In accordance with a further embodiment, the optoelectronic semiconductor chip is designed as a light-emitting and/or light-receiving semiconductor chip. For example, the optoelectronic semiconductor chip can be a light-emitting diode chip, a laser diode chip and/or a photodiode chip. Furthermore, at least two or even more optoelectronic semiconductor chips can be disposed on the carrier. Furthermore, it is also possible for further electronic components to be disposed on the carrier, e.g., protective diodes to prevent electro-static discharges, so-called ESD-protective diodes (ESD: "electro-static discharge").

In accordance with a further embodiment, the carrier is formed as a carrier plate. The carrier can thereby serve in particular as a planar carrier or as a planar or at least partially planar carrier plate for the optoelectronic semiconductor chip.

In accordance with a further embodiment, the carrier is formed as a housing having a housing recess. The housing recess which has a preferably planar or at least partially planar base surface can have the optoelectronic semiconductor chip disposed therein. In particular, the housing recess can have, e.g., laterally delimiting sidewalls which laterally surround an optoelectronic semiconductor chip disposed in the housing. In this case, the sidewalls can be oriented perpendicularly with respect to the base surface of the housing recess, but in a particularly preferred manner they can be at least partially oblique in formation, so that the housing recess has, e.g., a trough-like geometry having a cross-sectional surface which increases in size from the base surface. The sidewalls of the housing recess can be formed in particular such that they reflect the light, which is emitted by an optoelectronic semiconductor chip formed as a light-emitting semiconductor chip, or reflect the electromagnetic radiation which is to be received by an optoelectronic semiconductor chip formed as a light-receiving semiconductor chip. In particular, the reflector particles contained in the carrier material can be advantageous or even necessary for this type of reflection. The light which is emitted or is to be received can be in particular light at a wavelength from a spectral range of UV radiation to the spectral range of infrared radiation, in particular also visible light. The reflective sidewalls of the housing recess can be, e.g., ring-like, i.e., approximately circular or oval, in formation. Rectangular shapes or mixed shapes are also possible. In the optoelectronic semiconductor unit, the reflective sidewalls of the housing recess generally surround in a frame-like manner an optoelectronic semiconductor unit which is disposed in the housing recess.

In accordance with a further embodiment, the optoelectronic unit has a housing with a housing recess, in which an optoelectronic semiconductor chip is disposed, wherein the carrier forms the part of the housing recess of the housing. In particular, this can mean that the sidewalls and/or the base surface of the housing recess is/are formed by the carrier. Furthermore, the carrier can also be connected to, or at least partially surrounded by, a further material, in particular a further synthetic material which is different from the carrier material, so that the carrier together with the further material, in particular the further synthetic material, forms a synthetic material housing body of the housing. By virtue of the fact that the carrier is located preferably between the optoelectronic semiconductor chip and the further material, the second material can be selected irrespective of its optical properties, the light emitted, e.g., by a light-emitting semiconductor chip can fall only onto the carrier but not onto the further material.

In accordance with a further embodiment, the carrier has a lead frame, conductor paths and/or vias. As a result, the carrier can have in particular electrical connections, by means of which the optoelectronic unit and in particular the optoelectronic semiconductor chip can be electrically contacted on the carrier. Preferably, the optoelectronic semiconductor chip can be disposed or at least electrically contacted on electrical contact regions of the lead frame, a conductor path and/or vias.

In accordance with a further embodiment, the carrier has a filler compound disposed thereon which covers the optoelectronic semiconductor chip. The filler compound can be, e.g., transparent or translucent and comprise a synthetic material, e.g., a silicone, an epoxide or a silicone-epoxide hybrid material. Furthermore, it is also possible for the filler compound to have scattering particles which can be formed, e.g., like the above-described reflector particles of the carrier material. Furthermore, the filler compound can also have, e.g., one or a plurality of wavelength conversion substances which convert at least a portion of the light, which is emitted by an optoelectronic semiconductor chip formed as a light-emitting semiconductor chip, into light having a different wavelength, so that the optoelectronic unit can emit mixed-color light. Wavelength conversion substances and further materials for the filler compound are known to the person skilled in the art and therefore will not be explained further at this juncture.

If the carrier is formed as a carrier plate, the filler compound can be formed, e.g., as a lens-shaped formation of the optoelectronic semiconductor chip. In the case of a carrier which is formed as a housing with a housing recess, the filler compound can at least partially or even fully fill the recess and thereby form, e.g., a planar light-decoupling surface, by means of which the light, which is emitted by an optoelectronic semiconductor chip formed as a light-emitting semiconductor chip, can be emitted by the optoelectronic unit. Furthermore, it is also possible for the filler compound to be formed in a curved manner, e.g., in the shape of lens, over the housing recess, in order to permit, e.g., a desired radiation characteristic.

It can also be possible for a wavelength conversion element in the form of a conversion platelet or a directly applied wavelength conversion substance to be formed directly on an optoelectronic semiconductor chip formed as a light-emitting semiconductor chip. Furthermore, the optoelectronic semiconductor chip with the wavelength conversion element can be covered and formed with the filler compound.

In accordance with a further embodiment, in the case of a method for the production of a carrier or an optoelectronic unit, the carrier material is shaped in accordance with one of the above-described embodiments by injection-molding to form the carrier. As described above, the degree of crystallization of the carrier material can be influenced, e.g., by a slow cooling process.

The embodiments and features for the carrier, the carrier material and the optoelectronic unit, as described herein, apply equally to methods for the production of the carrier and to methods for the production of the optoelectronic unit and vice versa.

In accordance with a further embodiment, a cross-linking additive, e.g., tetraallyl isocyanurate, is added to the carrier material prior to the injection-molding process. By means of corresponding treatment of the carrier material after the injection-molding process, the carrier material can be at least partially subsequently cross-linked. The treatment can include, e.g., electron irradiation, thermal irradiation and/or irradiation with ultraviolet light. After injection-molding and shaping of the carrier, the carrier material can be at least partially subsequently cross-linked for instance by means of electron irradiation. It has been shown that particularly in the case of tetraallyl isocyanurate as a cross-linking additive, electron irradiation with an absorbed dose of greater than or equal to 65 kGy and less than or equal to 135 kGy is advantageous. The higher the absorbed dose of the electron irradiation, the greater the attainable degree of cross-linking can be in the carrier material, whereby the dimensional stability under heat can also be increased. Therefore, by suitable selection of the proportion of a cross-linking additive and the absorbed dose of the implemented electron irradiation, it is possible in a targeted manner to adjust the desired degree of cross-linking of the carrier material and thus the desired dimensional stability under heat of the carrier material and thus of the carrier. It has been shown that, as a result, carriers can be produced which have an adjustable dimensional stability under heat in the range of 250° C. to more than 300° C. For example, the carrier having the carrier material described herein can have a dimensional stability under heat of up to 310° C. As a result, it is possible for the carrier to be solderable and to be used in soldering processes such as, for instance, lead-free soldering. The cross-linking additive can be supplied to the carrier material prior to the injection-molding process in the manner described above by mixing or melt-mixing.

By adjusting the proportions of the described constituents of the carrier material, the mechanical properties of the carrier material and thus of the carrier can be optimized in order to maximize the service life of the carrier and in particular of an optoelectronic unit having the carrier. Furthermore, the carrier material can be used to produce a carrier or an optoelectronic unit with a carrier such that a high degree of reflectivity of more than 90% can be achieved in a visible spectral range, i.e., a blue to red spectral range, and in particular also in a spectral range which extends from near ultraviolet to infrared. The carrier material described herein can permit in particular carriers which have a high degree of reflectivity of more than 92% in a spectral range of 440 nm to 750 nm. The high ageing resistance means that the high degree of reflectivity can also be achieved over a long period of operation and preferably during the entire service life of an optoelectronic unit having the carrier described above, since even at elevated temperatures the carrier material described herein advantageously does not have any discolorations or at least substantially fewer discolorations in comparison with the material known in the prior art. The carrier material described herein can also be more favorable in terms of procurement and processing in comparison with known materials such as, e.g., polyamide.

BRIEF DESCRIPTION OF THE DRAWINGS

Further advantages and advantageous embodiments and developments are apparent from the embodiments described hereinafter in conjunction with the figures, in which.

Figure 1:
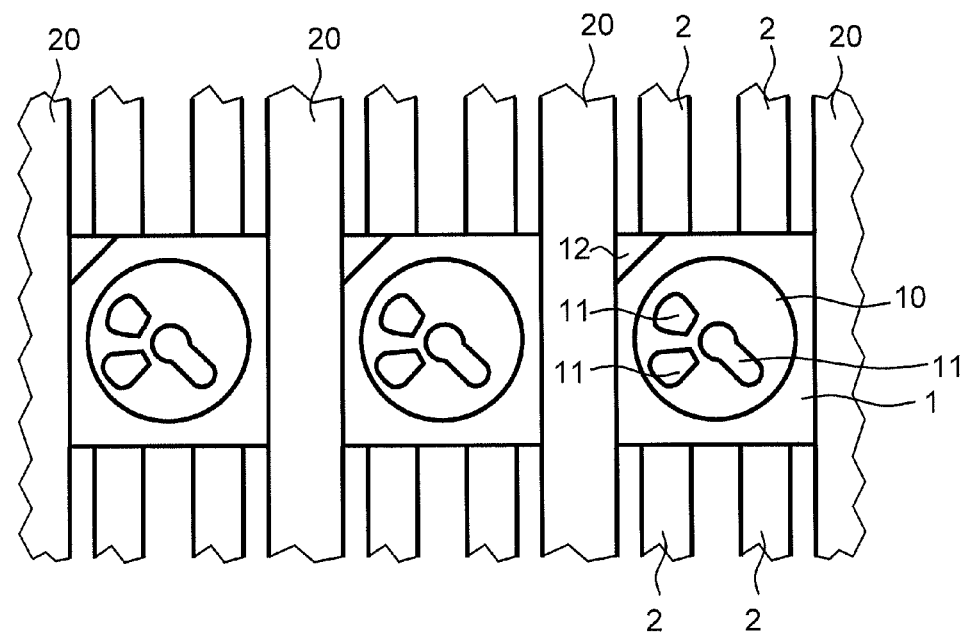
FIG. 1 shows a schematic illustration of a method step for a method for the production of a carrier in accordance with one exemplified embodiment.

In the exemplified embodiments and the figures, like parts, or parts acting in an identical manner, can be provided with the same reference numerals in each case. The illustrated elements and the size ratios of the elements with respect to each other are fundamentally not to be regarded as being to scale. Rather, individual elements, such as, e.g., layers, components, units and regions, may be illustrated excessively thick or large for better clarity and/or for ease of understanding.

DETAILED DESCRIPTION OF ILLUSTRATIVE EMBODIMENTS

FIG. 1 shows a method step for a method for the production of a carrier 1. The carrier 1 is produced from a carrier material by means of an injection-molding process. For this purpose, there is provided in the illustrated exemplified embodiment a lead frame composite 20 which provides, for a multiplicity of carriers 1, lead frames 2 which serve as electrical connection surfaces, contact surfaces and external electrical connections. As shown purely by way of example in FIG. 1, the carrier 1 can be formed as a housing having a housing recess 10, in which openings 11 are provided, through which the lead frame 2 can be contacted inside the housing recess 10. Furthermore, the housings 1 shown in the illustrated exemplified embodiment have a marking 12 in the form of a partially beveled corner of the carrier 1 which permits the arrangement and contacting of an optoelectronic unit with the carrier 1 illustrated in this case.

The carriers illustrated in this case are produced by injection-molding a suitable carrier material which in the illustrated exemplified embodiment comprises polyethylene terephthalate which contains reflector particles and a further filler. The filler can have or can be, e.g., titanium dioxide or also one or a plurality of the materials stated above in the general section. As a further material, glass fibers, which increase the mechanical strength and the dimensional stability under heat of the carrier 1 to be produced, are added to the carrier material. In the illustrated exemplified embodiment, the carrier material has a proportion greater than or equal to 15 wt. % and less than or equal to 30 wt. % reflector particles and a proportion greater than or equal to 20 wt. % and less than or equal to 50 wt. % and particularly preferably greater than or equal to 30 wt. % and less than or equal to 50 wt. % of the further filler. This type of carrier material can be used to produce carriers 1 which permit a dimensional stability under heat and thus solderability up to a temperature of 250° C.+/−5° C.

In order to further increase the dimensional stability under heat of the carriers 1, in particular to a soldering temperature of greater than or equal to 260° C. and up to 310° C., a cross-linking additive, in the illustrated exemplified embodiment tetraallyl isocyanurate having a proportion of greater than or equal to 2 wt. % and less than or equal to 4 wt. % of the total weight of the carrier material can be added to the carrier material. The tetraallyl isocyanurate can be mixed or compounded in a pure form as a liquid or also as a highly concentrated masterbatch in polybutylene terephthalate or polyethylene terephthalate into the carrier material, i.e., mixed in the melt. Tests have shown that the reflectivity and the ageing stability of the carrier described herein are not impaired by the addition of cross-linking additives such as, for instance, tetraallyl isocyanurate.

After the injection-molding process, the carriers 1, preferably in the lead frame composite 20, e.g., as lead frame strips or lead frame rolls, are passed through an electron beam installation where they are irradiated with electrons at an absorbed dose of greater than or equal to 65 kGy and less than or equal to 135 kGy. By selecting the proportion of the cross-linking additive and the absorbed dose in the electron beam installation, it is possible to adjust the degree of cross-linking of the carrier material in a targeted manner, whereby its dimensional stability under heat can also be adjusted in a targeted manner. The reflectivity and ageing stability are retained after cross-linking. The degree of crystallization of the carrier material and, therefore, the carrier 1 can be influenced by the injection-molding process and in particular the cooling procedure. As a result, the dimensional stability under heat can also be advantageously increased by a high degree of crystallization.

Furthermore, it is also possible to add to the carrier material not only the aforementioned constituents but also polybutylene terephthalate, e.g., in a proportion of less than or equal to 60 wt. %, preferably in a proportion of less than or equal to 20 wt. % and particularly preferably in a proportion of less than or equal to 10 wt. %, based upon the total weight of the carrier material. As a result, it is possible in an advantageous manner to increase the processability of the carrier material and also the readiness of the carrier material to crystallize.

The injection-molding process can be performed with the carrier material described herein at a relatively low tool temperature in a range of 100° C. to 120° C. The time required to produce the carriers 1, the so-called "cycle time" is less than 10 seconds, whereas in the case of known materials the cycle time is more than 12 seconds. Furthermore, the carrier material described herein is often more favorable for light-emitting diodes than known materials, thus resulting in a high level of efficiency.

Figure 3:
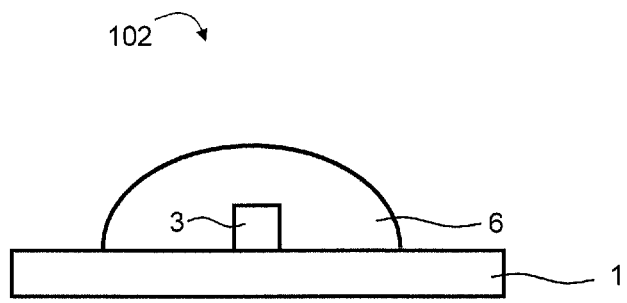

Whereas in conjunction with FIG. 1 the production of carriers 1 with lead frames 2 is shown, it is also possible to produce carriers 1, e.g., as planar carrier plates, such as shown in conjunction with FIG. 3.

Figure 2:
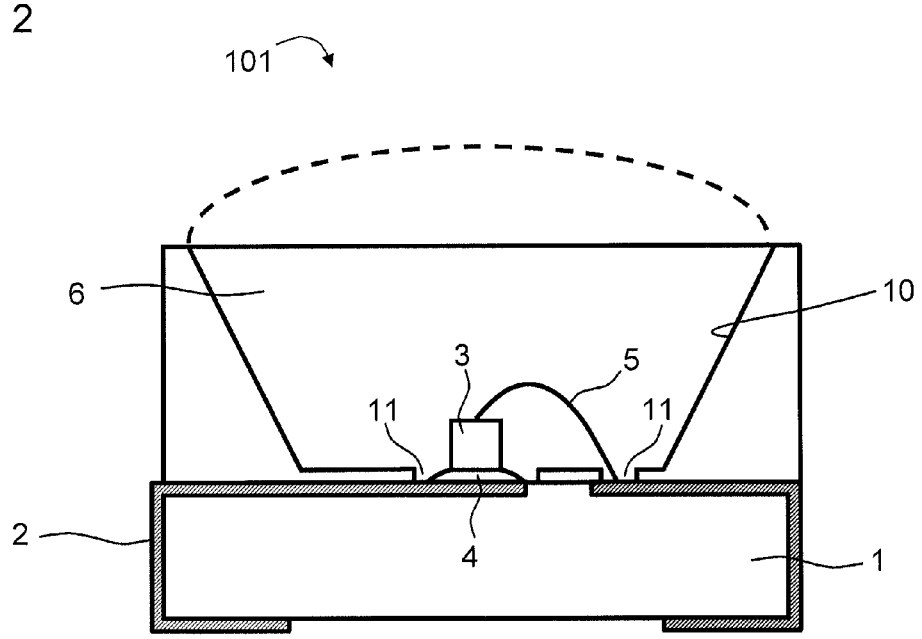
FIGS. 2 and 3 show schematic illustrations of optoelectronic units having a carrier in accordance with further exemplified embodiments.

FIG. 2 shows an optoelectronic unit 101 in accordance with a further exemplified embodiment which, purely by way of example, has a carrier 1 with a lead frame 2 which is produced in a method as described in conjunction with FIG. 1. In the housing recess 10 of the carrier 1, an optoelectronic semiconductor chip 3 is disposed and electrically connected on a base surface of the housing recess 10, said semiconductor chip being formed as a light-emitting semiconductor chip in the illustrated exemplified embodiment. In order to be able to effectively emit the light emitted by the light-emitting semiconductor chip, the housing recess 10 has oblique lateral surfaces which are reflective by reason of the reflector particles in the carrier material.

The light-emitting semiconductor chip is disposed and electrically connected on the lead frame 2 inside an opening 11 of the carrier 1 by means of a solder 4, preferably a lead-free solder. By means of a bond wire 5, the optoelectronic semiconductor chip 3 is connected in an electrically conductive manner to a further part of the lead frame 2 through a further opening 11 in the carrier 1. The electrical connection and the assembly of the optoelectronic semiconductor chip 3 in the optoelectronic unit 101 is to be understood purely by way of example and as non-limiting. Depending upon the design of the optoelectronic semiconductor chip and the carrier, other possible connections are also feasible which are known to the person skilled in the art and are not explained further at this juncture.

Also disposed on the optoelectronic semiconductor chip 3 can be, e.g., a wavelength conversion element (not shown) which converts at least a portion of the light, which is emitted by the optoelectronic semiconductor chip 3, into light having a different wavelength, so that the optoelectronic unit 101 can emit mixed-color light.

A filler 6 which in the illustrated exemplified embodiment is transparent and comprises, e.g., a silicone, an epoxide or a hybrid material thereof is disposed in the housing recess 10 above the optoelectronic semiconductor chip 3 on the carrier 1. Furthermore, it is also possible for the filler 6 to contain, e.g., scattering particles and/or a wavelength conversion substance. The filler can thereby form a planar surface which forms the radiation-decoupling surface of the illustrated optoelectronic unit 101. Furthermore, the filler 6 can also be formed in a curved manner and, e.g., as a lens, as indicated by the broken line, in order to influence the emission radiation characteristic of the optoelectronic unit 101.

It has been shown that in comparison with light-emitting diodes which have a housing body consisting of known materials such as polyamide, it is possible to achieve an increase in the brightness in flat-cast light-emitting diodes by 3 to 17%, depending upon the housing geometry and upon the semiconductor chip used. The dimensional stability under heat can be adjustable in a wide temperature range of about 250° C. to more than 300° C. Furthermore, the carrier material has a high reflectivity of more than 92% in a spectral range of 440 nm to 750 nm and excellent ageing stability, in particular in the case of an elevated temperature blue radiation.

FIG. 3 illustrates a further exemplified embodiment for an optoelectronic unit 102 which in comparison with the exemplified embodiment of FIG. 2 has a planar carrier 1 which is designed as a carrier platelet. An optoelectronic semiconductor chip 3 is disposed and electrically connected on this carrier platelet. Contact surfaces, conductor strips and optionally vias, by means of which the electrical connection of the optoelectronic semiconductor chip 3 is established, are not illustrated for the sake of clarity. Disposed above the optoelectronic semiconductor chip 3 and the carrier 1 is a filler 6 in the form of a lens which protects the optoelectronic semiconductor chip 3 and influences the properties of the optoelectronic semiconductor unit 102.

Figure 4:
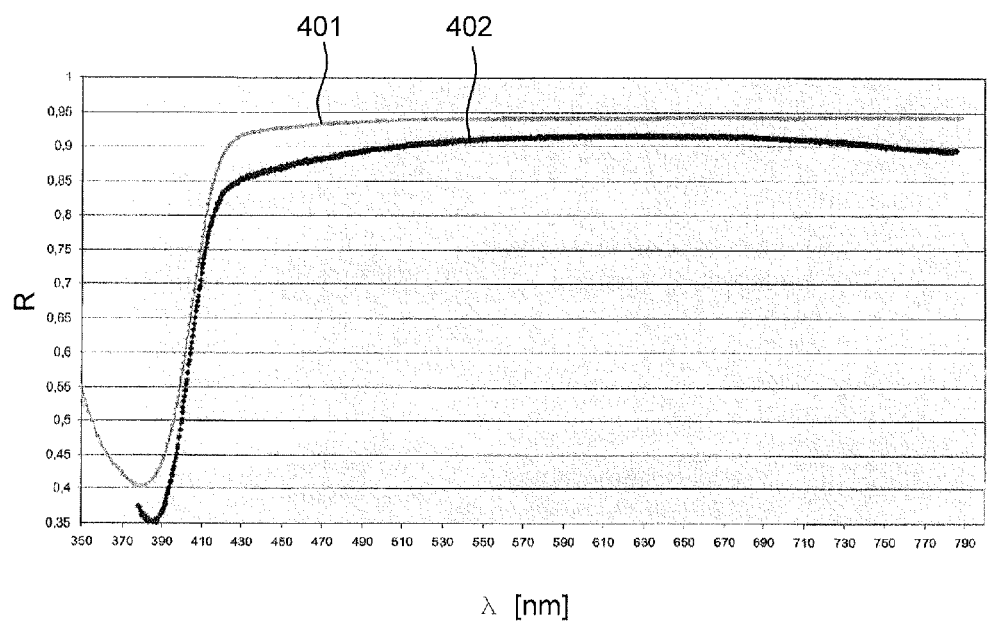
FIGS. 4 to 5D show measurements of parameters of carrier materials and carriers or optoelectronic units in comparison with the prior art.

FIG. 4 shows in the form of a curve 401 the reflectivity R as a function of the wavelength $\lambda$ in nm for a carrier material described herein. It is apparent from this that a reflectivity of more than 90% can be achieved in a spectral range with a wavelength of about 430 nm and more. In comparison to this, the curve 402 shows the reflectivity R of a standard high-temperature polyamide which in the same spectral range has a substantially lower reflectivity. Tests have revealed that the brightness of optoelectronic units having carriers consisting of the carrier material described herein could be increased when using blue-emitting semiconductor chips with blue light in the range of 444 nm by about 9% in luminous flux, as measured in lumen, and by 8% in light intensity, as measured in candela. In the case of green-emitting semiconductor chips with green light in a range of about 519 nm, it was possible to establish an increase in brightness of about 10% in luminous flux and in light intensity and in the case of white-emitting units having a color location with the chromaticity coordinates $cx=0.27$ and $cy=0.22$ it was possible to establish an increase in brightness of 9% in luminous flux and of 10% in light intensity in comparison with a standard high-temperature polyamide. Even when using red-emitting semiconductor chips with light in the range of 620 nm it was still possible to establish an increase in brightness of 3.5% in luminous flux and of 4.5% in light intensity in comparison with the material from the prior art.

FIGS. 5A to 5D show comparisons between optoelectronic units having carriers consisting of the carrier material described herein, and carrier consisting of a typically used high-temperature polyamide, wherein in each case the horizontal axis shows the time in hours and the vertical axis shows the luminous flux Iv as a measurement of the emitted brightness, stated in % relative to an initial value.

The reference numerals 501, 503, 505 and 507 designate measurements with the carrier material described herein, while the reference numerals 502, 504, 506 and 508 denote measurements with the typically used polyamide.

Figure 5A:
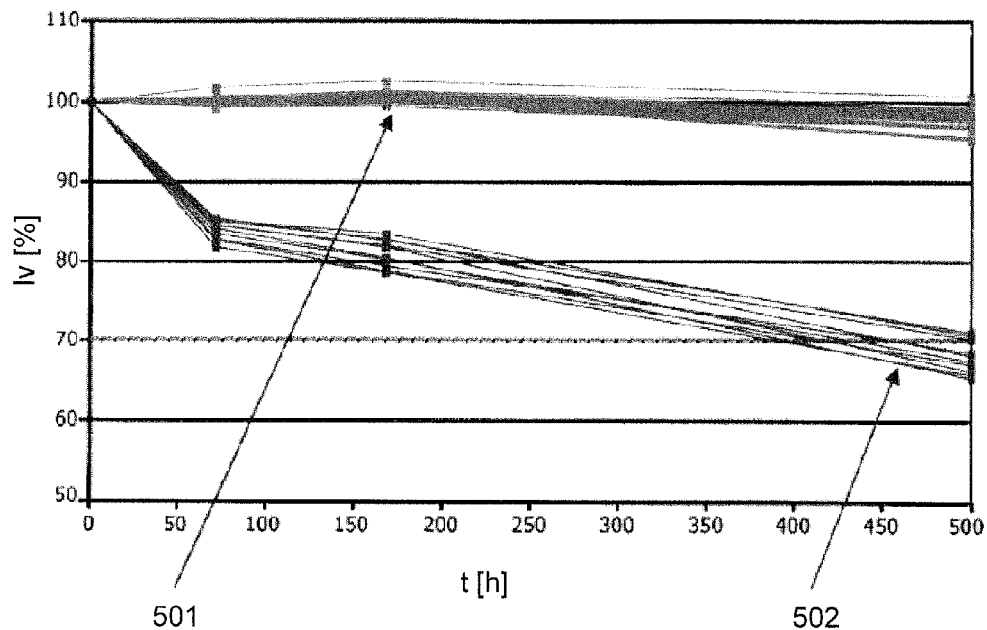
Figure 5B:
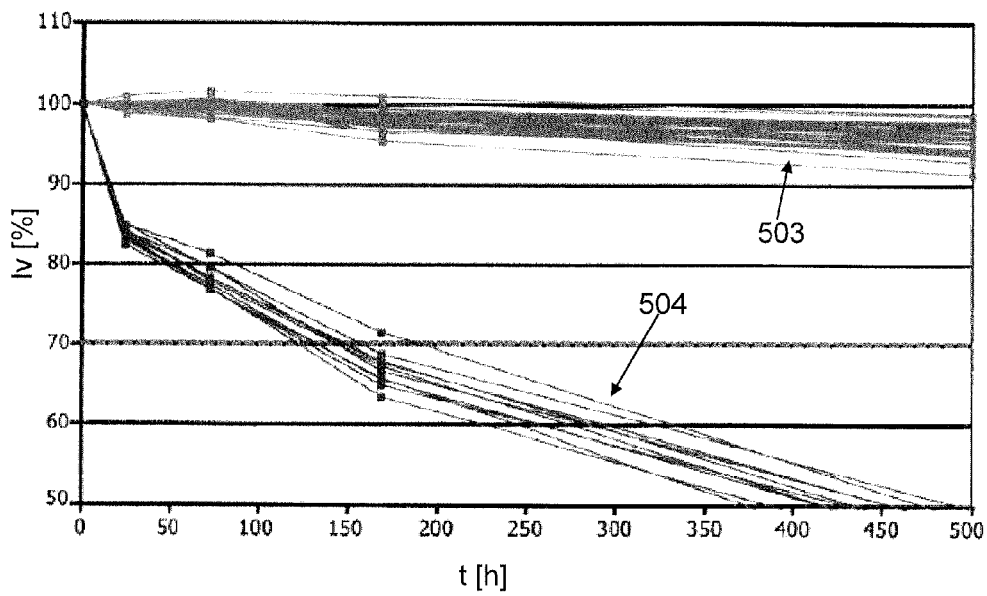
Figure 5C:
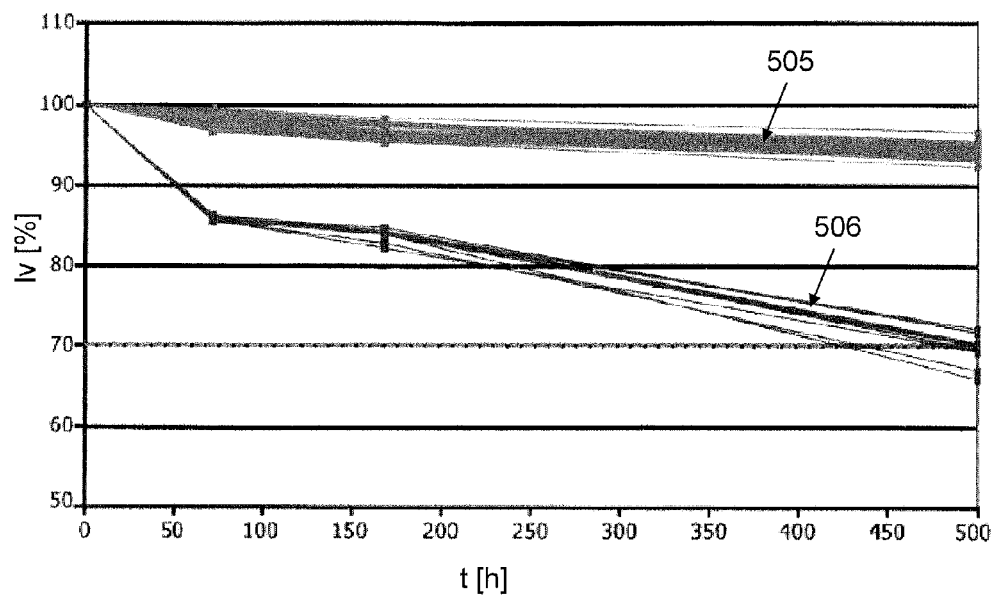
Figure 5D:
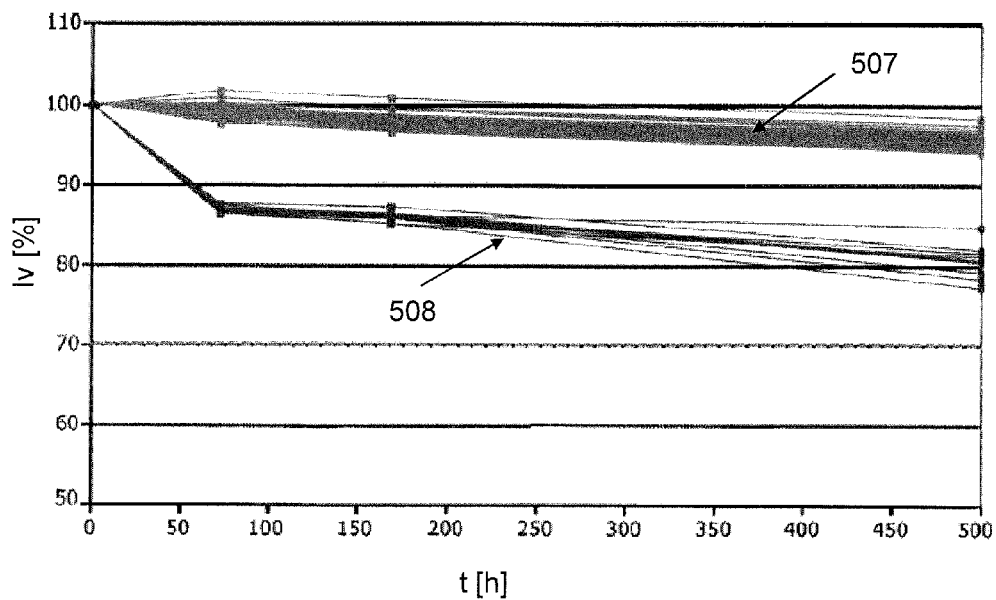

In the measurement in FIG. 5A, the carriers were subjected to an elevated temperature of 85° C. and an operating current for the light-emitting semiconductor chip used of 30 mA. In comparison with this, in the measurement in FIG. 5B the operating current was doubled. In the measurement in FIG. 5C, the light-emitting semiconductor chip used was operated in 30-minute On/Off cycles at a relative humidity of 85% and an operating current of 30 mA. The measurement in FIG. 5D was also conducted at a relative humidity of 85% and an operating current of 5 mA. All of the measurements established a partly considerable discoloration of the hitherto typically used polyamide material, which is shown by the decrease in the measured brightness in all of the measurements. In contrast, the optoelectronic units having carriers consisting of the carrier material described herein demonstrated comparatively small changes to absolutely no changes in brightness.

The invention is not limited by the description using the exemplified embodiments. Rather, the invention includes any new feature and any combination of features included in particular in any combination of features in the claims, even if this feature or this combination itself is not explicitly stated in the claims or exemplified embodiments.

The invention claimed is:

1. A carrier for an optoelectronic unit having a carrier material that comprises polyethylene terephthalate that contains reflector particles and a further filler, wherein the reflector particles have a proportion of greater than or equal to 15 wt. % and less than or equal to 30 wt. %, and the further filler has a proportion of greater than or equal to 20 wt. % and less than or equal to 50 wt. % of the carrier material.

2. The carrier according to claim 1, wherein the carrier material further contains a cross-linking additive that is at least partially cross-linked with the polyethylene terephthalate.

3. The carrier according to claim 2, wherein the cross-linking additive comprises tetraallyl isocyanurate and has a proportion of greater than or equal to 2 wt. % and less than or equal to 4 wt. % of the carrier material.

4. The carrier according to claim 2, wherein the further filler comprises at least one or a plurality of the following materials: glass fibers, glass spheres, cellulose fibers, mineral filler.

5. The carrier according to claim 1, wherein the further filler is formed by glass fibers.

6. The carrier according to claim 1, wherein the reflector particles comprise at least one or a plurality of the following materials: titanium oxide, zinc oxide, zirconium oxide, barium sulphate.

7. The carrier according to claim 1, wherein the carrier material also comprises polybutylene terephthalate in a proportion of less than or equal to 60 wt. %.

8. The carrier according to claim 1, wherein the carrier material also comprises polybutylene terephthalate in a proportion of less than or equal to 20 wt. %.

9. The carrier according to claim 1, wherein the carrier material also comprises polybutylene terephthalate in a proportion of less than or equal to 10 wt. %.

10. The carrier according to claim 1,
wherein the carrier material also contains a cross-linking additive that is at least partially cross-linked with the polyethylene terephthalate;
wherein the carrier material also comprises polybutylene terephthalate in a proportion of less than or equal to 20 wt. %;
wherein the reflector particles have a proportion of greater than or equal to 15 wt. % and less than or equal to 30 wt. %;
wherein the further filler has a proportion of greater than or equal to 20 wt. % and less than or equal to 50 wt. % of the carrier material; and
wherein the further filler comprises at least one or a plurality of the following materials: glass fibers, glass spheres, cellulose fibers, mineral filler.

11. An optoelectronic unit comprising:
a carrier; and
an optoelectronic semiconductor chip disposed on the carrier;
wherein the carrier is formed as a carrier plate or as a housing with a housing recess in which the optoelectronic semiconductor chip is disposed; and
wherein the carrier comprises polyethylene terephthalate that contains reflector particles and a further filler, and
wherein the reflector particles have a proportion of greater than or equal to 15 wt. % and less than or equal to 30 wt. %, and the further filler has a proportion of greater than or equal to 20 wt. % and less than or equal to 50 wt. % of a carrier material.

12. The optoelectronic unit according to claim 11, wherein the optoelectronic semiconductor chip is a light-emitting semiconductor chip.

13. The optoelectronic unit according to claim 11, wherein the optoelectronic semiconductor chip is covered by a filler compound, which is disposed on the carrier.

14. A carrier for an optoelectronic unit having a carrier material that comprises polyethylene terephthalate that contains reflector particles and a further filler, wherein the carrier material further contains a cross-linking additive that is at least partially cross-linked with the polyethylene terephthalate.

15. The carrier according to claim 14, wherein the cross-linking additive comprises tetraallyl isocyanurate and has a proportion of greater than or equal to 2 wt. % and less than or equal to 4 wt. % of the carrier material.

16. The carrier according to claim 14, wherein the further filler comprises at least one or a plurality of the following materials: glass fibers, glass spheres, cellulose fibers, mineral filler.

17. The carrier according to claim 14, wherein the further filler is formed by glass fibers.

18. The carrier according to claim 14, wherein the carrier material also comprises polybutylene terephthalate in a proportion of less than or equal to 60 wt. %.

19. The carrier according to claim 14, wherein the carrier material also comprises polybutylene terephthalate in a proportion of less than or equal to 20 wt. %.

20. The carrier according to claim 14, wherein the carrier material also comprises polybutylene terephthalate in a proportion of less than or equal to 10 wt. %.

* * * * *